(12) United States Patent
Sane et al.

(10) Patent No.: US 6,670,025 B2
(45) Date of Patent: Dec. 30, 2003

(54) PYROLYTIC BORON NITRIDE CRUCIBLE AND METHOD

(75) Inventors: Ajit Y. Sane, Medina, OH (US); Jeffrey Lennartz, Cleveland, OH (US); Arthur Moore, Strongsville, OH (US); Thomas Devan, Westlake, OH (US)

(73) Assignee: General Electric Company, Pittsfield, MA (US)

( * ) Notice: Subject to any disclaimer, the term of this patent is extended or adjusted under 35 U.S.C. 154(b) by 40 days.

(21) Appl. No.: 09/865,395

(22) Filed: May 24, 2001

(65) Prior Publication Data

US 2002/0182394 A1 Dec. 5, 2002

(51) Int. Cl.[7] .............................. B32B 9/00; B32B 7/02; B01L 3/04
(52) U.S. Cl. ..................... 428/216; 428/336; 428/704; 428/698; 428/408; 432/156; 432/262; 432/264; 427/255.28
(58) Field of Search .................... 428/408, 216, 428/215, 336, 704, 698; 432/156, 262, 264; 373/45, 72, 156, 163; 427/255.28

(56) References Cited

U.S. PATENT DOCUMENTS

| 4,544,535 A | 10/1985 | Branovich et al. |
|---|---|---|
| 4,913,652 A | 4/1990 | Tanji et al. |
| 5,674,317 A | 10/1997 | Kimura et al. |
| 6,197,391 B1 * | 3/2001 | Kimura et al. .......... 427/255.28 |

FOREIGN PATENT DOCUMENTS

| JP | 8-34684 | * | 6/1996 | ........... C04B/41/87 |
|---|---|---|---|---|
| JP | 10-203894 | * | 4/1998 | ........... C30B/23/08 |

* cited by examiner

Primary Examiner—Deborah Jones
Assistant Examiner—Vivek Koppikar

(57) ABSTRACT

A method of forming a pyrolytic boron nitride (PBN) article and an article having layers of PBN separated by layers of PBN having a dopant of sufficient concentration to induce peeling, the steps of introducing vapors of ammonia and a gaseous boron halide in a suitable ratio into a heated furnace reactor to cause boron nitride to be deposited in layers on a substrate, with at least one gaseous dopant injected into furnace at controlled periodic interval(s) such that at least two selected layers of boron nitride are doped with said gaseous dopant(s) at a minimum average concentration of 2 atomic wt % at a depth ranging from 1000 to 2000 angstroms in each selected layer, and with the selected layers spaced apart about 0.1 micron to 100 microns apart.

25 Claims, 11 Drawing Sheets

Double Cantilever Beam Test

Fig. 1 Double Cantilever Beam Test
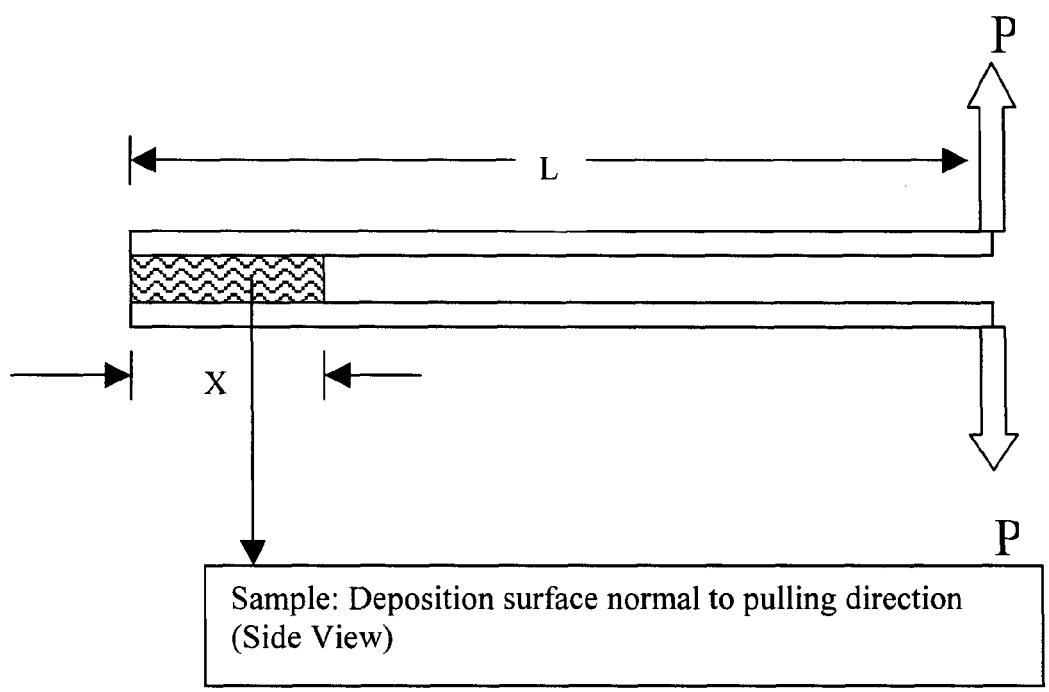
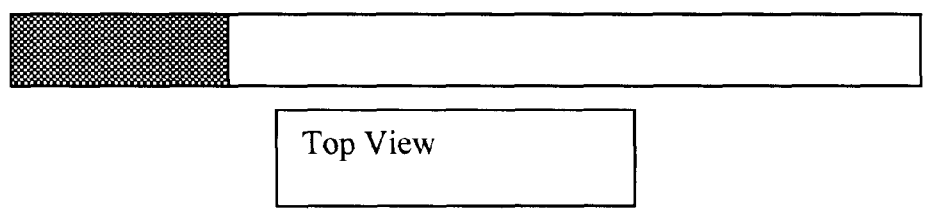

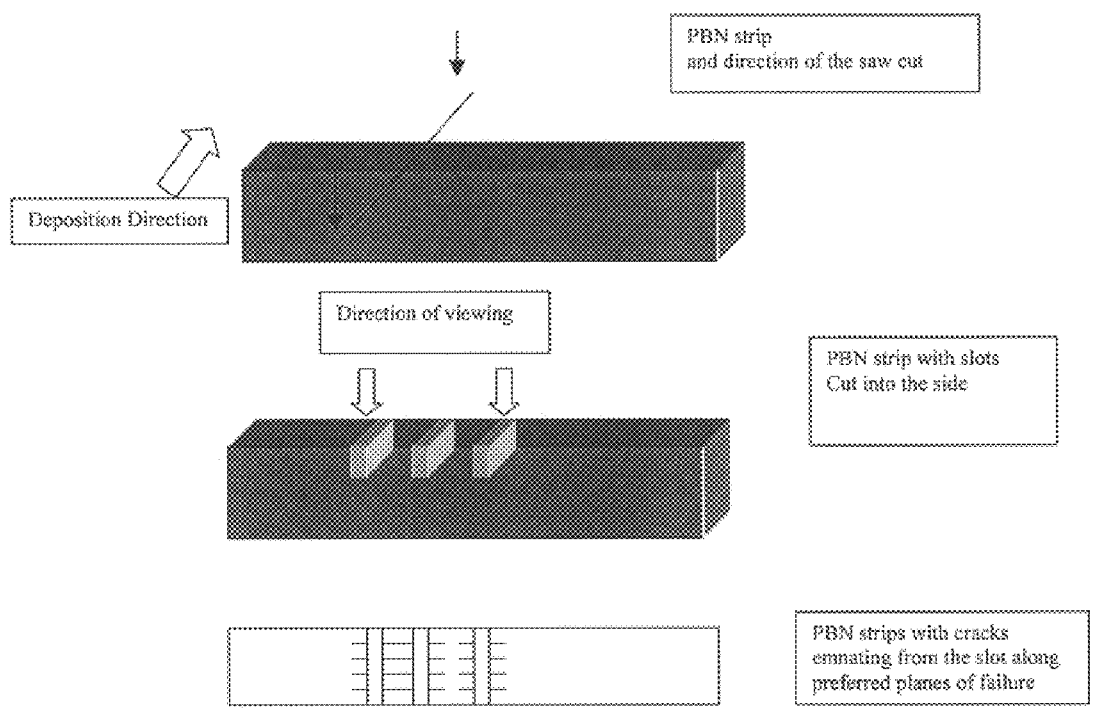

A Typical Example of Delineation of Preferred Failure Planes from the Slot Test
(Example 4)

Edge-Edge = 0.92 mm

Slot Test Results on Sample from Example 5 (10138T5-9)

Edge to Edge = 0.92 mm

Slot Test Result from Prior Art 1

Edge to Edge = 0.92 mm

Slot Test Result on Samples from Prior Art 2

Edge to Edge = 1.84 mm

Typical Dopant Concentrations: Average Values at a Given Depth (Example 1)

Example of Highly doped Oxygen Rich Interface (Example 5)

Example of Highly Doped Carbon Rich Interface (Example 4)

Example of Prior Art 1

Effect of Interfacial Concentration of Dopants or Impurities (Prior Art 1) on Peel Strength

PYROLYTIC BORON NITRIDE CRUCIBLE AND METHOD

This invention relates to a pyrolytic boron nitride article having laminated layers of anisotropic boron nitride in which a plurality of selected layers are doped with a minimum concentration of dopant sufficient to preferentially induce peeling in one or more of the selected layers and to a method for manufacturing a pyrolytic boron nitride article consisting of laminated layers of anisotropic boron nitride in which a dopant is incorporated into a plurality of selected layers for preferentially inducing peeling of one or more of the selected layers relative to a given surface of the crucible.

BACKGROUND OF THE INVENTION

Pyrolytic boron nitride is formed by chemical vapor deposition using a process described in U.S. Pat. No. 3,182,006, the disclosure of which is herein incorporated by reference. The process involves introducing vapors of ammonia and a gaseous boron halide such as boron trichloride ($BCl_3$) in a suitable ratio into a heated furnace reactor causing boron nitride to be deposited on the surface of an appropriate substrate such as graphite. The boron nitride is deposited in layers and may be separated from the substrate to form a free standing structure of pyrolytic boron nitride. Pyrolytic boron nitride is an anisotropic material having an hexagonal crystal lattice with properties perpendicular to the basal plane, known as the "c-plane", which are significantly different from its properties parallel to the plane, known as the "a-plane". Because of the high degree of anisotropy the mechanical strength of the free standing pyrolytic boron nitride (hereafter "PBN") structure is weak in the perpendicular direction which is the direction of PBN layer growth.

Crucibles of PBN are used commercially to melt compounds at elevated temperatures. For example, in the production of semiconductors, crucibles of PBN are used to grow GaAs crystals. A PBN crucible is, however, subject to fracture from a build up of stress. For example when using the Liquid Encapsulated Czochralski method to produce single crystals of GaAs, fracture of the PBN crucible can occur after the crystal is grown and a boric oxide glass $B_2O_3$, which is used to cover part of the molten mass, freezes in the crucible. On freezing the boric oxide ($B_2O_3$) glass shrinks more than the crucible. The resultant shrinkage mismatch generates stresses within the PBN crucible that can cause it to fracture. Similarly boric oxide is often used as an encapsulant for GaAs in the vertical gradient freeze (VGF) method. The bond between the boric oxide and the PBN surface and the shrinkage mismatch of the boric oxide and PBN on cooling causes a radial tensile stress (perpendicular to the layers) and a compressive stress (parallel to the layers) in the PBN. This causes large stresses to develop in the PBN which, in turn, can cause delamination i.e. peeling to occur or fracture. Ideally, the PBN should peel away in thin layers of controlled thickness, providing an improved and predictable service life which would also eliminate the risk of catastrophic failure. In the past there was no way to predict to the number of layers that would peel off. For a crucible to have a long service life, it is necessary to control peeling and to preferably limit peeling to a single selected PBN layer of controlled thickness for each crystal growth run. Moreover, the single selected layer should peel uniformly from the body of the crucible when the boric oxide glass is withdrawn.

SUMMARY OF THE INVENTION

The present invention is directed to a PBN article such as a crucible of laminated layers containing anisotropic boron nitride and to a method for forming a PBN crucible having laminated layers of anisotropic boron nitride in which a plurality of selected layers contain a dopant in a predetermined minimum concentration sufficient to induce peeling of one or more selected layers in the crucible. In accordance with the present invention, the selected layer or layers contain dopant(s) of sufficient minimum average concentration to induce peeling and should be spaced a predetermined distance apart from one another. Preferably only one layer of PBN will peel off the crucible during each crystal growth operation. The dopant causes peeling to propagate along the layer plane such that peeling of the layers is uniform. The preferred spacing between the selected layers should be between about 0.1 micron and 100 microns for a crucible of given thickness to permit the number of crystal growth runs to be estimated in advance. Each of the selected layers within the PBN crucible should be doped with an elemental dopant preferably selected from the group consisting of carbon and/or oxygen, alkali metals, alkaline earth metal(s), transition metal(s), and rare earth metal(s) or selected from group 1–6 of the periodic table and/or any combination thereof with at least one of the dopants being present at a minimum average concentration of 2 atomic % when measured at a depth in a range from about 1000 to 2000 angstroms from the interfacial fracture surface (the surface of the peeled layer).

Broadly, the pyrolytic boron nitride article of the present invention comprises layers of pyrolytic boron nitride in which a plurality of selected layers contain a dopant in a concentration sufficient to induce peeling of one or more selected layers with the average minimum concentration of dopant in each selected layer being above at least 2 atomic % at a depth in a range from about 1000 to 2000 angstroms measured from the surface of the peeled layer and with each of the selected layers being spaced a predetermined distance apart of between about 0.1 micron to 100 microns. Preferably only one of the selected layers will peel off from the crucible for each use of the crucible to grow crystals in the production of semiconductors.

A pyrolytic boron nitride crucible is formed in accordance with the method of the present invention comprising the steps of introducing vapors of ammonia and a gaseous boron halide in a suitable ratio into a heated furnace reactor to cause boron nitride to be deposited in layers on a substrate, injecting at least one gaseous contaminant into the furnace at controlled periodic interval(s) such that at least two selected layers of boron nitride are doped with said gaseous contaminant(s) at a minimum concentration level of above 2 atomic % at a depth ranging from about 1000 to 2000 angstroms in each selected layer, controlling the interval of injection to space the selected layers between about 1 micron and 100 microns apart and separating the crucible from the substrate.

BRIEF DESCRIPTION OF THE DRAWINGS

FIG. 1 is a diagram illustrating a conventional double cantilever beam test procedure for calculating the peel strength to peel off a layer of PBN from a sample strip of PBN material formed in accordance with the present invention;

FIG. 2A is a schematic drawing illustrating a "Slot Test" to identify the planes of failure in a strip of PBN formed in accordance with the present invention;

DETAILED DESCRIPTION OF THE INVENTION

Figure 2B:
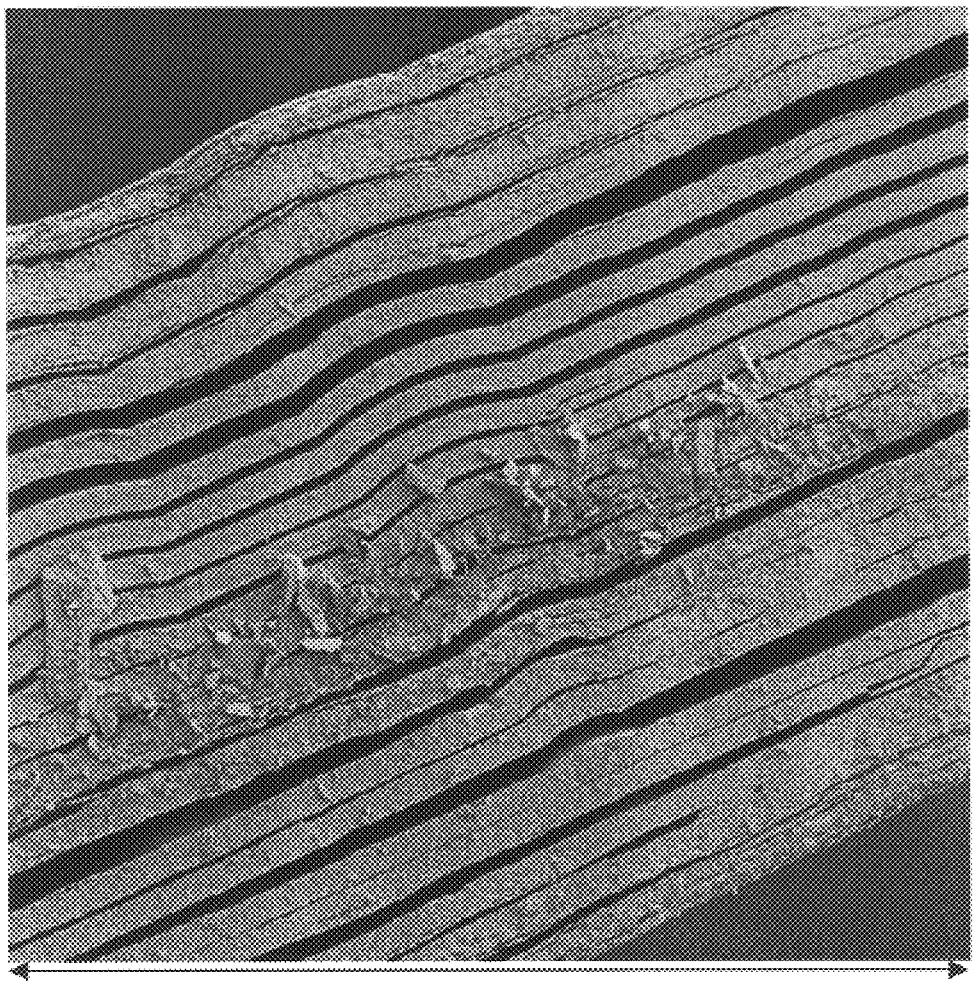
FIG. 2B is a photomicrograph showing the delineation of the preferred failure planes using the Slot Test of FIG. 2A for a strip of PBN formed in accordance with the present invention under the conditions corresponding to Example #4 in Table 1.

It has been discovered in accordance with the present invention that the bond strength between PBN layers in a PBN crucible can be controllably altered by introducing a dopant such as carbon and/or oxygen in selected layers to induce and control the sequence of peeling of the PBN crucible in each of the selected layers based upon the concentration of dopant and the interval of separation. The dopants should be introduced during the deposition process in discrete steps or the concentration of dopant periodically varied so as to cause an abrupt and significant change in the concentration at selected intervals corresponding to the selected layers.

The PBN deposit consists of laminated layers of PBN in which selected layers are preferentially weakened by the presence of a dopant to induce peeling along the plane of each selected layer in the deposit. Therefore, when a PBN crucible formed from the deposit is subjected to a buckling load (in-plane compression), radial tension or a peeling load, crack propagation will occur at the weakest point, which is along the interface (plane of the layer). Since this interface is generated during the layerwise deposition process, uniform peeling can be assured.

Generally the deposition of PBN may be controlled at a constant rate which is modified by the inclusion of a short pulse of one or more dopant gases at selected intervals so that the selected dopant(s) will be incorporated into the PBN at selected layers spaced a predetermined distance apart. Alternately the deposition of PBN could be altered or interrupted at the time dopants are introduced. The dopant(s) may include any element selected from groups 1–6 of the periodic table and preferably one or more of the following elements, C, O, Si, Al, Ga and/or alkali metal(s), alkaline earth metal(s), transition metal(s) or rare earth metals or combinations thereof. Dopants such as C and O may be introduced by injection of such materials as $CH_4$, $O_2$, $N_2O$, air, CO, $CO_2$ or any suitable mixtures of O containing species such as water with carbon containing species such as ethane, propane, methanol, and ethanol. The choice of dopant and its concentration relative to $BCl_3$ is determined by processing conditions and application. For example, in an application involving Ga crystal growth, oxygen alone or in combination with small amounts of carbon may be injected.

Concentration of the dopant in PBN that results from the pulse is determined by the concentration of dopant relative to that of the boron containing reactive species such as $BCl_3$ in the gas phase. The pulse duration is determined by the desired thickness for the doped layer. Flow rate, duration and composition of the pulse have been found to control mechanical properties, specifically the peel strength. The doped interval must be short so as to produce a controlled doped layer of given thickness with the pulse duration significantly smaller than the time intervals between the pulses so that the doped layers are distinct and spaced apart from one another by a fixed distance corresponding to the doping interval. The process is then repeated until the total thickness of PBN deposit is achieved. The thickness of the doped layer should preferably be in a range of 100–3000 angstroms and the thickness or spacing between doped layers should preferably be in the range of 0.0.1–100 microns, more preferably 1–75 microns and optimally 2–50 microns. The doped layers are thinner by a factor of 2 to 100,000 relative to the other thicker layers. The minimum average concentration of dopant(s) in the PBN should be 2 atomic. % at a depth in the range about 1000–2000 angstroms measured from the peeled surface. More preferably, the total minimum average concentration when more than one dopant is present such as C and O should be 3.5 atomic % at a depth of about 1000 to 2000 angstroms with either C or O having the desired minimum average concentration of 2 atomic %. The thicker PBN layers may also contain a minority composition of components selected from one or more of the following: $Si_3 N_4$, SiC, AN, TiN, C, boron carbonitride, boron oxynitride and boron oxycarbide. The thicker PBN layers may also show a gradient in the composition of the minority components along the direction of deposition.

PBN materials were formed in accordance with the present invention in a cylindrical graphite furnace based CVD reactor. Reactant gases were introduced in a heated chamber within a water-cooled steel vacuum chamber. Graphite substrates or mandrels were placed above a nozzle through which reactant gases flowed into the heated chamber. Water-cooled coaxial injectors were used. Temperature was monitored by an optical pyrometer and a vacuum transducer monitored chamber pressure. Temperature and pressure were maintained at a desired level. $BCl_3$ and $NH_3$ gases were kept separate until being admitted into the hot zone. At the desired intervals, dopant gases ($CH_4$, $N_2O$, CO, $CO_2$, etc.) were mixed with $NH_3$. Dopants were typically admitted for between 5 and 60 seconds at intervals of 15 to 90 minutes depending upon the deposition rate. The time interval at which a pulse of dopant gas or gas mixture was introduced was chosen so that doped layers were preferably 20 to 30 microns apart. After the desired level of deposit thickness, reactive gases were turned off and furnace power was switched off. Deposition conditions are described in Table I. After cooling, PBN deposited in the target region was removed from the graphite substrate and analyzed for its properties. In case of Example No. 4 and 5, crucibles were produced for their evaluation in a boric oxide melt test. Graphite mandrels were rotated around their axis to produce uniform wall thickness.

1. A strip of e.g. 10–15 mm in width was cut from the deposit and the cut surfaces were smoothened by polishing with a fine grit SiC paper (typically 400 grit or finer).
2. A series of slots were cut into the strip using a wafering saw such that the cutting rim of the blade was made to

TABLE I

Processing Conditions for Producing Interfacially Doped Pyrolytic Boron Nitride

| Example No. | Reference Sample | Pulse Gas (slpm) | Pulse Gas (slpm) | Pulse Interval (min) | Pulse Duration (sec) | BCl3 (slpm) | NH3 (slpm) | N2 (slpm) | Temperature (C.) | Pressure (mm. Hg) | Typical Dep. Rate (Microns/Hr) |
|---|---|---|---|---|---|---|---|---|---|---|---|
| | | CO | CO2 | | | | | | | | |
| 1 | 1N4-3-4-4 | 0.5 | | 15 | 5 | 0.5 | 1.5 | | 1800 | 0.5 | 100–180 |
| 2 | 1N4-3-4-6 | 0.5 | | 15 | 5 | 0.5 | 1.5 | | 1800 | 0.5 | 100–180 |
| 3 | 1N7-3-6-3 | | | 15 | 15 | 0.5 | 1.5 | | 1800 | 0.5 | 100–180 |
| | | Ch4 | N2O | | | | | | | | |
| 4 | 1652B3 UW1 21 | 1.3 | 0.4 | 90 | 30 | 1.1 | 2 | 1 | 1730 | 0.4 | 20 |
| 5 | 10138t5-9 | 0.14 | 2.3 | 60 | 30 | 1.45 | 2.6 | | 1730 | 0.3 | 30 |
| 6 | N60 | 0 | 0.42 | 15 | 15 | 0.5 | 1.5 | | 1800 | 0.5 | 100–180 |
| 7 | N62 | 0.5 | 0.2 | 15 | 15 | 0.5 | 1.5 | | 1800 | 0.5 | 100–180 |

A double cantilever beam (DCB) test as shown in FIG. 1 was used to measure peel strength. Beams of aluminum were used having dimensions 12–13 mm wide, 50–51 mm long and about 2 mm thick. Samples were cut carefully from a PBN deposit by using a wafering saw. A PBN plate was used having a rectangular geometry of 12–14 mm long, 10–12 mm wide and a thickness corresponding to the thickness of the deposit. In most cases, the thickness of the PBN plate was less than 3 mm. The sample was bonded between the aluminum beams by an epoxy resin in such a way that the edge of the PBN closest to the applied force was normal to the beam axis so as to initiate uniform peeling from the edge. The two edges of the beam were pulled apart at a constant speed of 2.54 mm/min in a mechanical strength-testing machine made by Instron. A calibrated load cell measured load and the value of the maximum force was obtained from the load-displacement curve. The peel strength was calculated from the maximum load, P (measured in Newton force) required to initiate crack propagation.

The peel strength was calculated as:

$$S = (P/W)*(L/X) \quad (1)$$

where S is the peel strength (N/mm), i.e., it represents the effective force P (N) acting at the crack front of width W (mm) to cause crack propagation, L is the length of the cantilever beam (mm) as well as the distance between the loading point and the opposite end of the sample, and X is the sample length (mm) along the beam. Several pieces from a deposit were tested for their strength.

The strength data was analyzed in terms of two-parameter Weibull statistics. By plotting Ln(Ln(1/1−F)) vs. Ln S, and using linear regression value of S at a failure probability of 0.5 (or median) and Weibull modulus, m, were calculated. F is the cumulative failure probability. These two values were used to represent strength of the PBN deposit.

Figure 2C:
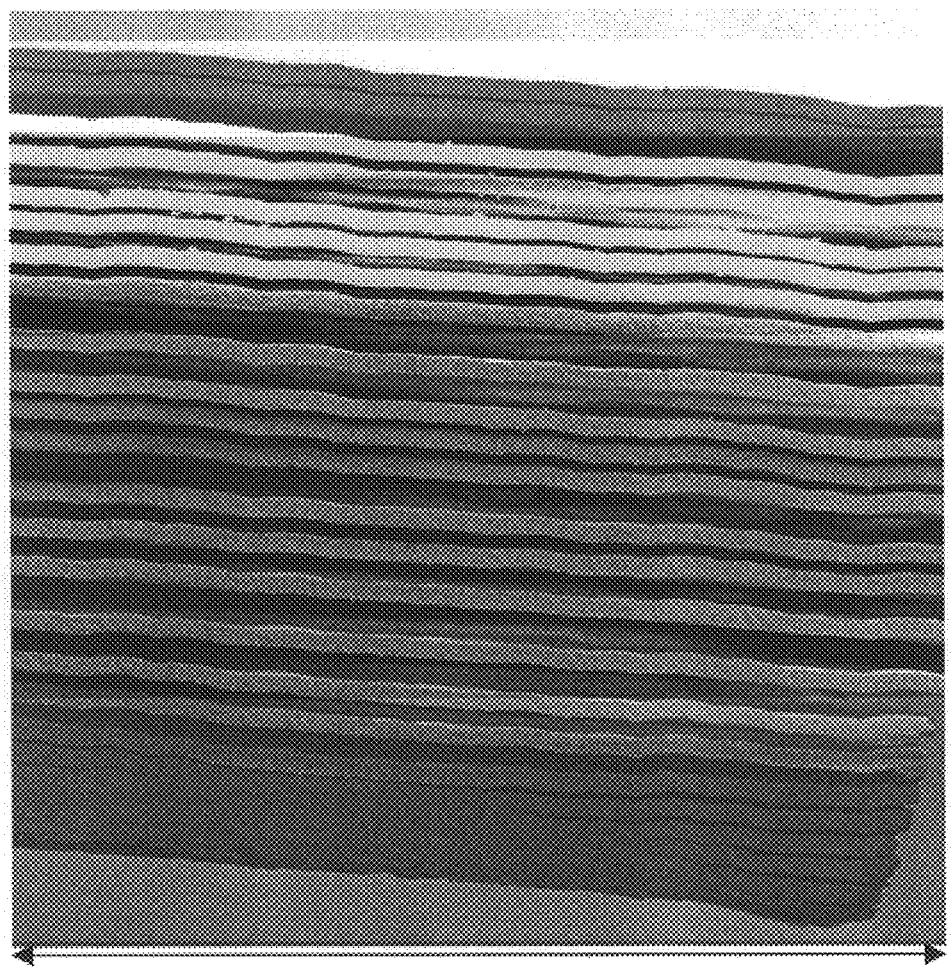
FIG. 2C is a photomicrograph showing the delineation of the preferred failure planes using the Slot Test of FIG. 2 for a strip of PBN formed in accordance with the present invention under the conditions corresponding to Example #5 in Table 1.
Figure 2D:
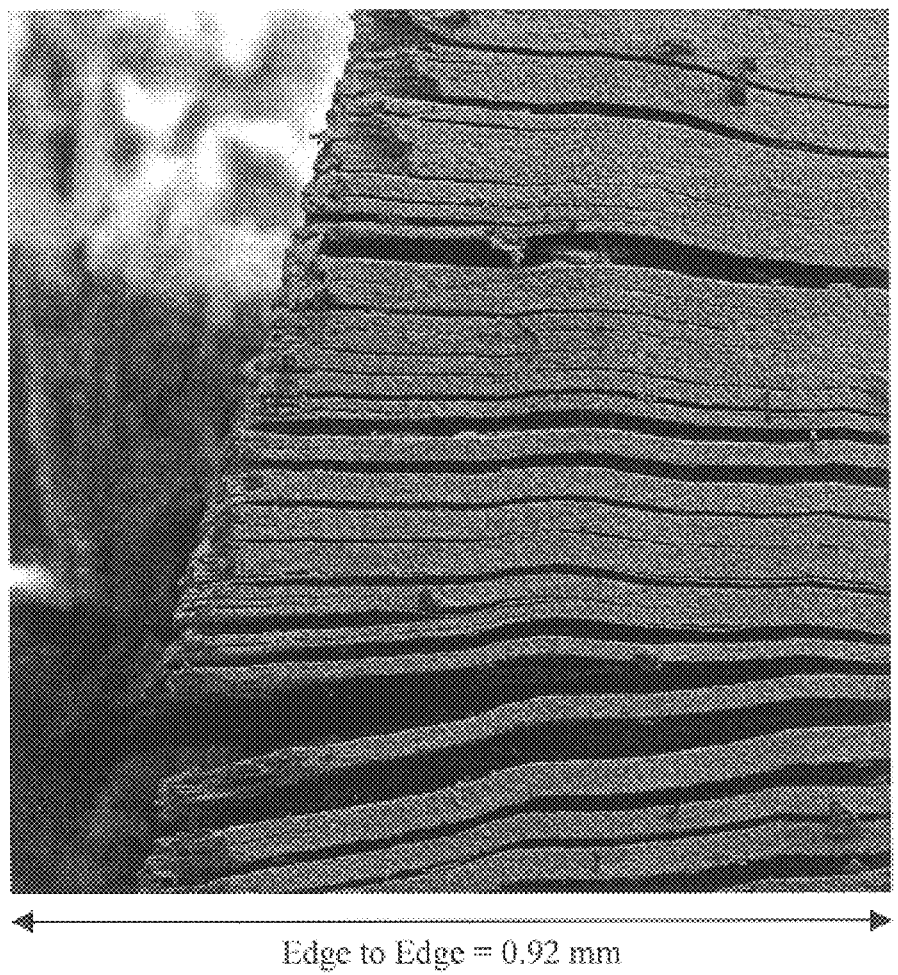
FIG. 2D is a photomicrograph showing the delineation of the failure planes for a conventional strip of PBN, not formed in accordance with the present invention, corresponding to Example #8 in Table No. 2.
Figure 2E:
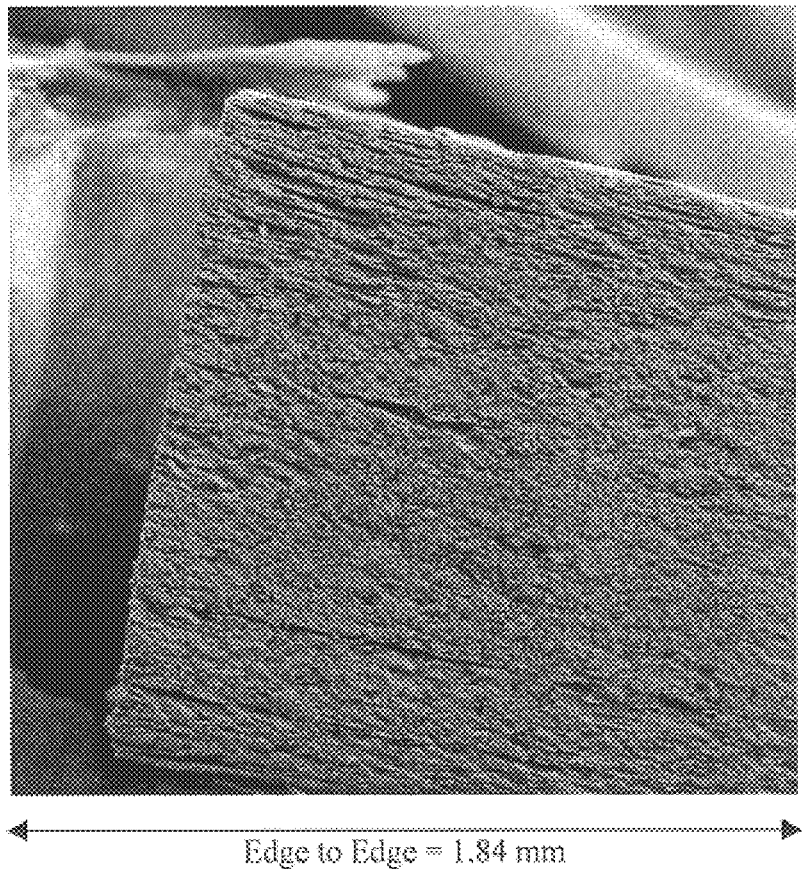
FIG. 2E is a photomicrograph of another conventional strip of PBN, not formed in accordance with the present invention, corresponding to Example #9 in Table No. 2, which did not exhibit any preferred failure planes.
Figure 3A:
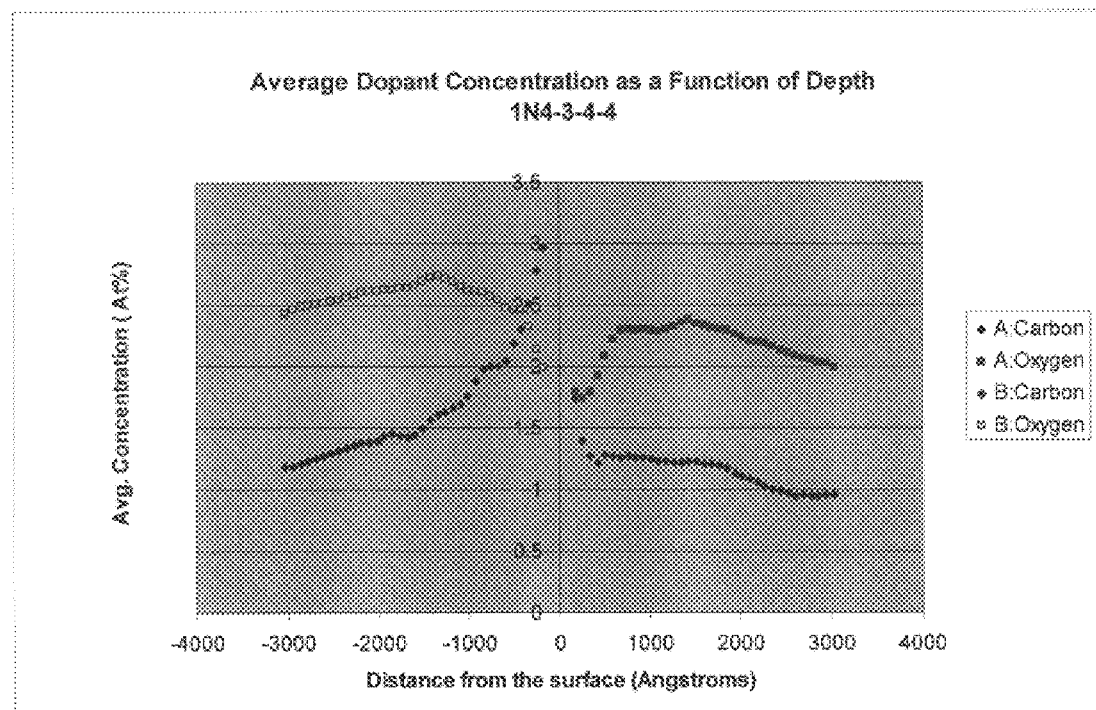
FIG. 3A is a graph showing the average dopant concentration in a selected layer of PBN corresponding to Example No. 1 in Table No's 1 and 2, as a function of distance (depth) from the interfacial fracture surface (peeled surface) of the selected layer.
Figure 3B:
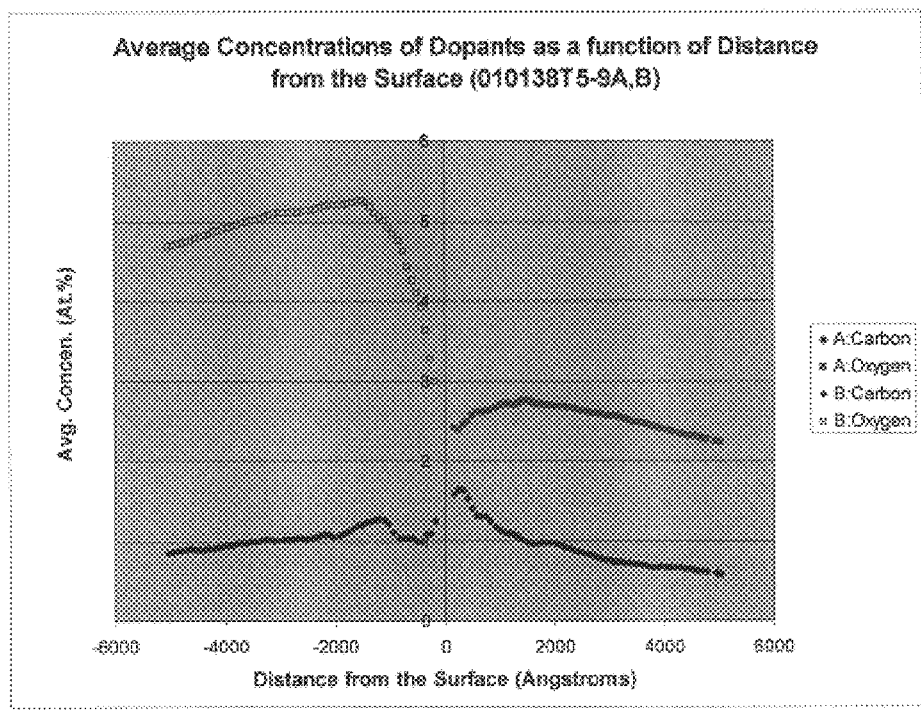
FIGS. 3B and 3C are graphs showing the average concentration of a mixture of carbon and oxygen in a PBN layer corresponding to Example No. 5 and 4 in Table No's 1 and 2 as a function of depth measured from the surface of the peeled layer.
Figure 3:
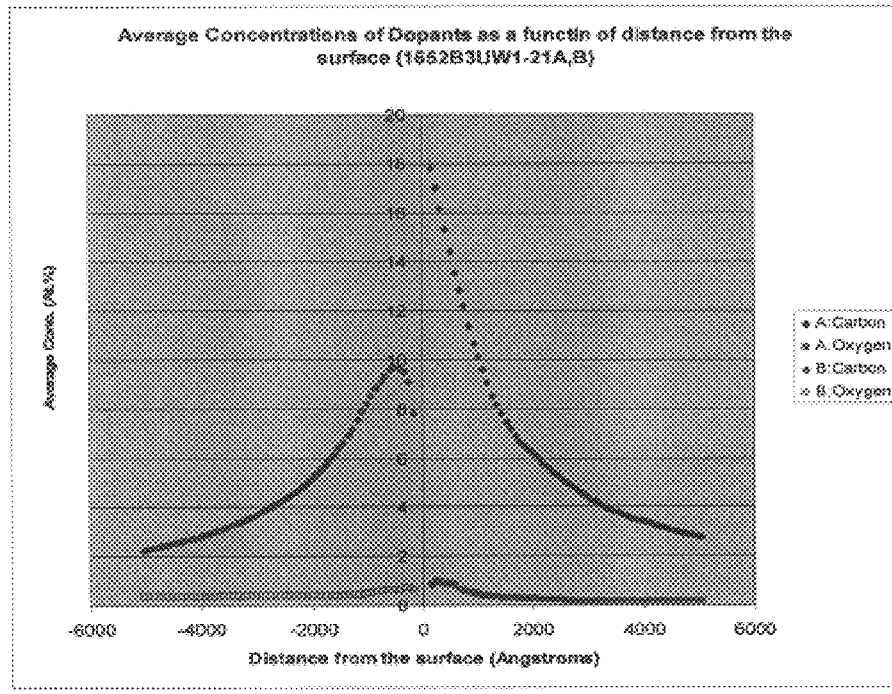
FIG. 3D is a graph showing the average concentration of oxygen and carbon in a conventional strip of PBN corresponding to Example #8 in Table No. 1 of 2, as a function of depth measured from an interfacial fracture surface.
Figure 3D:
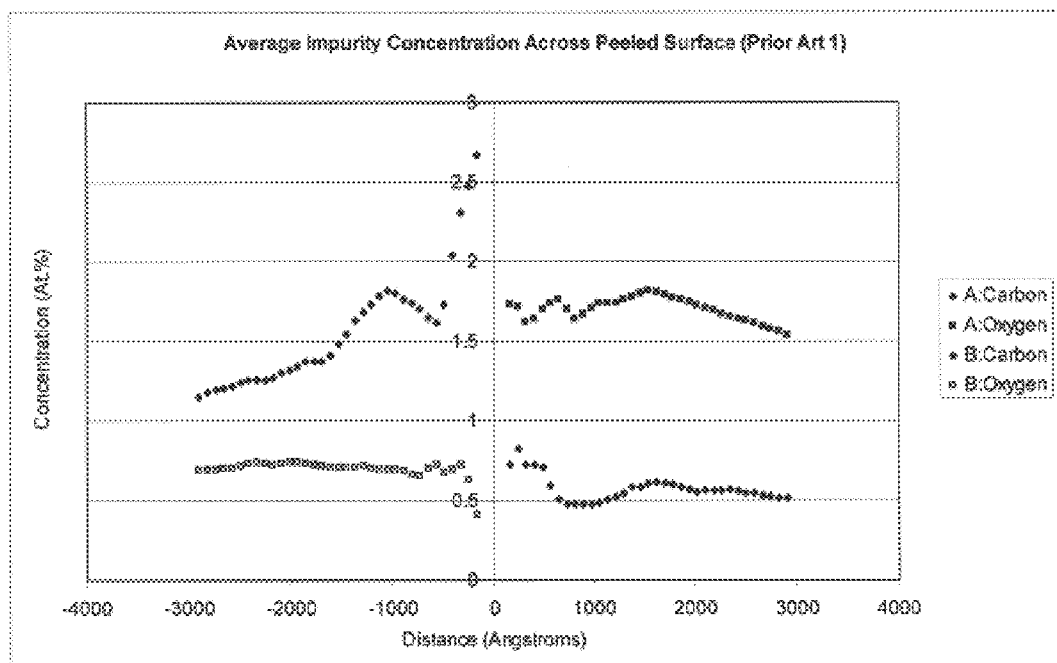
Figure 4:
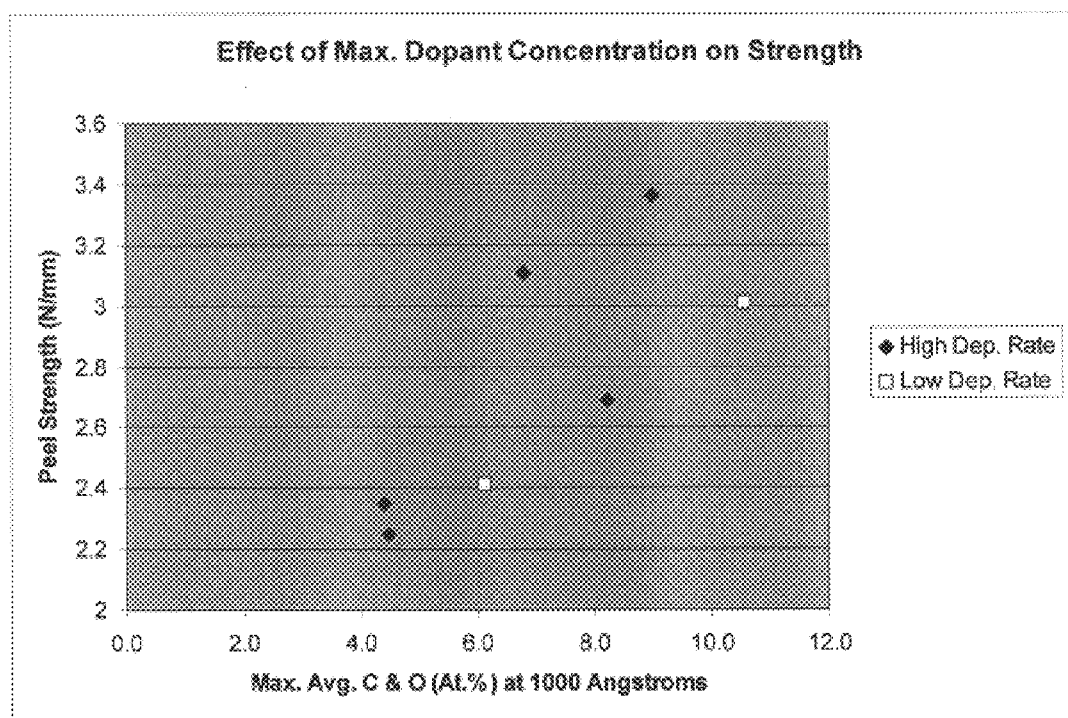
FIG. 4 is a graph showing the correlation between the average concentration of dopants to the median peel strength at a given distance from the interfacial fracture surface.
Figure 5:
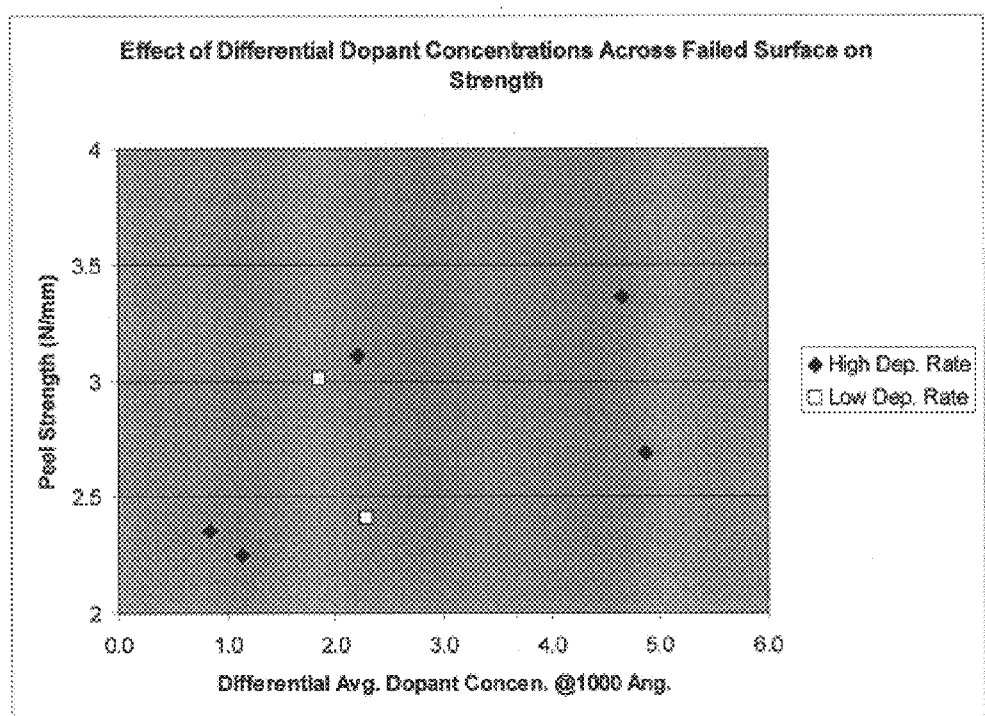
FIG. 5 is a graph showing the correlation of differential dopant concentrations on peel strength at a given distance from the interfacial fracture surface.

In accordance with the present invention peeling occurred along the plane of a doped layer when subjected to forces normal to the plane. To reveal the planes of failure in a sample of PBN a "Slot Test" was used as shown in FIG. 2, and according to the following test procedure:

rub against the cut surface. Its purpose was to induce random vibrations and stresses that were localized to the slot being cut into the strip.
3. An optical microscope was used to examine edges of the slot that meet the sanded surface.
4. Small hairline cracks were introduced along planes parallel to the deposition plane as shown in FIG. 2.
5. Spacings between the cracks were compared with spacings expected from the deposition rate and pulse intervals. For example, if the deposition rate is 20 microns per hour and if every hour a pulse of dopant gas is introduced for a short duration, e.g., 15 seconds, then cracks will be observed that are spaced at 20 micron intervals.

Table I identifies seven PBN deposit examples formed in accordance with the present invention in which peeling occurred uniformly along the interface.

Interfacial composition was determined by x-ray photoelectron spectroscopy (XPS). Samples from peel strength tests were used to determine surface and near-surface composition. In all cases, both of the new surfaces created by peeling were analyzed to determine composition.

Analytical services of Case Western Reserve University, Cleveland, Ohio were used for determining dopant concentrations in the PBN deposits produced according to this invention. For comparison, the existence of impurity concentrations in prior art PBN samples were determined similarly. The analytical equipment used was a PHI ESCA 5600 manufactured by Physical Electronics. Monochromated aluminum K-alpha x-ray radiation with 800 micron aperture was used for the analysis. Incident angle for focussed x-rays was 45 degrees and take-off angle for analyzing photoelectrons was also 45 degrees. Argon sputtering was conducted (from the side at 45 degrees) with a sputtering rate of 42 angstroms per minute. Sputtering rate was calibrated using a $Ta_2O_5$ reference. Specimen neutralizer (electron flood gun) was set at 10% to 30% of 35 volt maximum.

Standard sample preparation techniques for surface analysis experiments were used. After analyzing the surface, depth profiles were generated by sputtering away layers of PBN and then conducting XPS analysis. Measurements were made typically at 10 to 80 angstrom intervals. Depth of a layer was determined by the sputtering rate. In all cases, carbon and/or oxygen containing species adsorbed on the surface confounded data collected on layers up to 20–40 angstroms deep. A shift in the binding energy was observed when contaminated layers were removed. For example, binding energy for carbon at the surface indicated that it was characteristic of weakly bonded carbon. Binding energy of carbon detected on the surface after removing 20–40 angstroms showed characteristics similar to strongly bonded carbon such as boron carbide. Therefore data obtained at the surface (typically less than 40 angstroms) was ignored.

XPS analysis gave atomic concentrations of boron, nitrogen, carbon and oxygen at a given depth. The data was used to compute average concentration in the layer as a function of its depth from the surface. Concentrations profiles of dopants, specifically carbon and oxygen, were calculated to determine their distribution relative to the fracture or peeled surface. For the purpose of comparison, average concentrations of dopants or impurities at two different depths were determined.

If the deposit was cut carefully by a wafering saw in a direction normal to the deposition plane, then examination of edges near the cut revealed delamination of layers. The number of layers that separated during cutting were generally equal to the number expected from the total number of pulses used for interfacial doping. In other words, by introducing a pulse of dopants, a delamination or peeling along that layer was assured. FIGS. 2B–E are micrographs of some of the samples from the experiments listed in Table I and of samples representing prior art 1 and 2 listed in Table II.

Table II is a compilation of the results of the surface analysis tests on reference samples 1–10. Slot tests revealed that the number of fracture planes contained within a PBN deposit made according to this invention was generally equal to the number of pulses of dopants introduced during the course of deposition process. Weibull statistics was used to analyze peel strength data. In all the cases, peeling during strength measurement occurred uniformly along the interface.

TABLE II

Results of Surface Analysis (XPS) on Peeled Surfaces, Strength and Slot Tests

| Example No. | Reference Sample | Side A AT 1000 Ang. | Side B At 1000 Ang. | Side A AT 2000 Ang. | Side B At 2000 Ang. | Max C + O At 1000 Ang. | Comp. Diff. At 1000 Ang. | Median Peel Strength (N/mm) | Slot Test: Layered |
|---|---|---|---|---|---|---|---|---|---|
| 1 | 1N4-3-4-4 | C:1.25 O:2.29 | C:1.77 O:2.62 | C:1.1 O:2.24 | C:1.4 O:2.63 | 4 39 | 0.850 | 45; 6.31 | Yes |
| 2 | 1N4-3-4-6 | C:2.3 O2.18 | C.1.37 O:1.97 | C:1.77 O:2.16 | C:1.18 O:1.9 | 4.48 | 1.140 | 22; 4.59 | Yes |
| 3 | 1N7-3-6-3 | C:3.22 O:5.76 | C:1.59 O:2.74 | C:2.36 O:6.22 | C:1.43 O:3.27 | 8.98 | 4.650 | 3.,36; 17.9 | Yes |
| 4 | 1652B3-UW1-21 | C:10.14 O:0.44 | C:8.24 O.0.49 | C:6.14 O:0.25 | C 5.14 O:0.4 | 10.58 | 1.850 | 3.01; 5,71 | Yes |
| 5 | 10138T5-9 | C.1.14 O:2.7 | C:1.21 O:4.92 | C:0.97 O:2.68 | C:1.05 O:5.2 | 6.13 | 2.290 | 2.41; 4.47 | Yes |
| 6 | N60 | C:1.23 O 3.36 | C:1.38 O:5.42 | C:0.9 O:3.37 | C:1.01 O:6.19 | 6.8 | 2.210 | 3.11; 6.81 | Yes |
| 7 | N62 | C:1.09 O:7.12 | C:1.91 O:1.44 | C:0.85 O:7.98 | C:1.42 O:1.42 | 8.21 | 4.860 | 2.69; 5.73 | Yes |
| 8 | Prior Art 1 | C:0.48 O:1.73 | C:1.81 O:0.69 | C:0.56 O:1.72 | C:1.32 O:0.56 | 2.5 | 0.290 | 1 84; 8.57 | Yes, sublayers |
| 9 | Prior Art 2 818E | C:2.49 O:4.51 | C:2.36 O.2.81 | | | 7.00 | 1.830 | 3.27;* | No |
| 10 | Prior Art 2 818K | C:1.93 O:5.33 | C:2.65 O:4.25 | | | 2.26 | 0.360 | 0.24;* | No |

*Strength of individual sample taken from different location in article; overall bi-modal strength distribution A & B: A: median 0.72 N/mm, Weibull Modulus 1.93 B: Median 1.75 N/mm, Weibull Modulus 2.55.

For the above example No.'s 1–7 in Table II, the number of layers of fracture planes were general agreement with the number of pulses introduced during the deposition process. Example No. 8 (Prior Art 1) is a commercial PBN crucible available through Shin-Etsu chemicals of Japan. The slot test revealed (See FIG. 2D) the presence of a number of layers that re evenly spaced through the thickness. According to the product literature of Shin Etsu Chemicals these layers were produced as a result of varying the density of the as-deposited PBN. Example No.'s 9 and 10 (labeled Prior Art 2) represent conventional PBN crucibles commercially available from the Advanced Ceramics Corporation of Ohio. The slot test did not show any evenly spaced layers (See FIG. 2E). Similar results were obtained on a number of other commercially available PBN crucibles which were not included in Table II. As a result, removal of PBN layers due to freezing of boric oxide during LEC or in the VGF process are not predictable and may not be uniform or consistent.

The following properties distinguish the subject invention from conventional practice:
1. The planes along which peeling or fracture can be engineered are substantially parallel to one another.
2. The stress at which the layers can be separated or peeled is controlled by the concentration of dopants at the planes of failure. Furthermore, concentration of a particular dopant, e.g., oxygen can be controlled by using a gas mixture having a suitable ratio of carbon to oxygen to other species, e.g., ratio of $CH_4$ to $N_2O$.
3. The number of crystal growth runs can be predicted in advance for a PBN crucible of given thickness.

The above characteristics permit a prolonged crucible life for GaAs crystal growth in a given PBN crucible during the manufacture of semiconductors. If the crucible is usable up to 50% of the thickness, then a two millimeter wall thickness is expected to give 50 crystal growth runs per crucible provided only a 20 micron thick layer is removed during each run An article made up of layers of PBN separated by thin layers of PBN doped with elements in concentrations sufficient to induce peeling of layers, with the average minimum concentration of dopants in each of the selected layers being above at least 2 at. % at a depth ranging from about 1000–2000 angstroms measured from the point of peeling and with each of the doped layers being spaced at least one micron apart permits for a PBN crucible of given thickness the number of crystal growth runs to be predicted in advance.

It should be understood that the selection of dopants and dopant concentration may be varied during deposition of PBN to vary and control the strength of the layers relative to one another. This allows an article to resist spontaneous delamination when thickness/radius ratio is increased. It is well known that PBN, on account of its anisotropy, gives rise to significant levels of residual stresses when wall thickness to radius of curvature ratio is increased significantly. So an article with different radii of curvature but similar wall thickness would have to possess sufficiently high peel strength to resist delamination.

It should also be understood that addition of hetero-atoms to the bulk PBN may be incorporated into this invention so as to enhance the material performance. For example, high concentrations of carbon along with oxygen can be incorporated in order to change optical properties.

It should also be understood that PBN precursor flow rates may be continuous throughout the formation of layered structure or they may be interrupted during the dopant introduction.

The layer peeling behavior of PBN made according to the invention was also tested by melting and freezing boric oxide in 6-inch diameter PBN crucibles of the type used for growing GaAs by the vertical gradient freeze (VGF) method.

Five boric oxide melt and freeze tests were done on each of two PBN crucibles made according to the invention and one test using a commercially available (conventional) crucible. Some 1500 grams of boric oxide was placed in a 6-inch diameter VGF crucible and heated to 1100 degrees C. for one hour and then cooled to room temperature. The boric oxide lump was then removed from the crucible and the PBN layers which peeled off were removed. The test was then repeated. The table below shows the results of 5 boric oxide melt tests on each of two crucibles made according to the invention and on one conventionally made.

| Crucible Number | Process | Initial weight (g) | Avg wt loss per run (g) | Peel thickness (mm) Average | Range (mm) |
|---|---|---|---|---|---|
| 138-B3 | Invention | 206.3 | 3.36 | 0.40 | 0.030–0.045 |
| 138-T4 | Invention | 190.4 | 2.68 | 0.033 | 0.025–0.045 |
| 1196-T2 | Conventional | 210.0 | 8.08 | 0.095* | 0.10–0.40 |

*based on density and average weight loss per run

The results of peeling from the crucibles made according to the invention are highly reproducible from run to run and the measured average peel thickness is in good agreement with that calculated from the average weight loss per run divided by surface area and density. In contrast, the crucible made by the conventional process peeled very unevenly, with very thick layers in some regions and no peeling in other areas. The average weight loss per run was also much higher in the crucible made by the conventional process.

What we claim is:

1. An article comprising a first plurality of layers containing pyrolytic boron nitride (PBN) and a second plurality of layers containing PBN and at least one elemental dopant selected from the group of elements in groups 1–6 of the periodic table of elements, alkali metal(s), alkaline earth metal(s), transition metal(s) and rare earth metal(s) or combinations thereof; said second plurality of layers separating some or all of the first plurality of layers with the dopant in the second plurality of layers being present in a sufficient concentration to induce peeling upon a build up of internal stress along a fracture plane in at least one of the second plurality of layers with said dopant being present on both sides of the fracture plane and with said dopant having a minimum concentration of 2 atomic weight % at a depth ranging from about 1000 to 2000 angstroms measured from the surface of the peeled layer and with each of the layers in the second plurality of layers being spaced apart from one another a distance of at least one tenth of one micron.

2. An article as defined in claim 1 wherein each of the second plurality of the layers are separated a distance of about 0.1 micron to 100 microns.

3. An article as defined in claim 2 wherein the second plurality of layers are thinner than the first plurality of layers.

4. An article as defined in claim 3 in which the planes along which peeling occur are substantially parallel to one another.

5. An article as defined in 4 wherein the dopant is selected from the group consisting of carbon and/or oxygen or mixtures thereof.

6. An article as defined in claim 5 wherein the total average dopant concentration for dopants of both C and O is above 3.5 atomic % within a distance of 1000 to 2000 angstroms from each peeled surface.

7. An article as defined in claim 6 wherein the median peel strength of each peeled layer lies in the range of 2–5 N/mm.

8. An article as defined in claim 1 wherein said first plurality of layers further includes minority components selected from the group consisting of one or more of the following: $Si_3N_4$, SiC, AlN, TiN, C, boron carbide, boron carbonitride, boron oxynitride and boron oxycarbide.

9. An article as defined in claim 8 wherein the minority components show a gradient in composition along the direction of deposition such that concentration of at least one element will vary in excess of 0.1%.

10. A method of forming a pyrolytic boron nitride article comprising the steps of introducing vapors of ammonia and a gaseous boron halide in a suitable ratio into a heated furnace reactor to cause boron nitride to be deposited in layers on a substrate, injecting at least one gaseous dopant into the furnace at controlled periodic interval(s) such that at least two selected layers of boron nitride are doped with said gaseous dopant(s) to at least a minimum concentration of 2 atomic wt % at a depth ranging from 1000 to 2000 angstroms in each selected layer, controlling the interval injection to space the selected layers from about 0.1 micron to 100 microns apart and separating the article from the substrate such that upon the application of stress in a direction substantially normal to the plane of deposition for the boron nitride layers peeling will be induced to occur in a doped layer along a fracture plane in which dopant is present on both sides of the fracture plane.

11. A method according to claim 10, in which the flow rates of ammonia and gaseous boron halide are altered during the dopant introduction.

12. An article composed of layers of pyrolytic boron nitride (PBN) separated by layers of PBN doped with one or more elements selected from Group 1–6 of the periodic table, transition metals, rare earth metals, or combinations thereof such that the dopant is in a concentration in each of the doped layers above at least 2 atomic weight % at a depth ranging from about 1000–2000 angstroms measured from the surface of a peeled layer to induce peeling in each of the doped layers in a given sequence upon a build up of internal stress along a fracture plane in the peeled layer in which dopant is present on both sides of the fracture plane and with each of the doped layers being spaced at least one tenth of one micron apart.

13. An article as defined in claim 12 wherein the doped layers are separated by about 0.1 micron to 100 microns.

14. An article as defined in claim 13 wherein the doped layers are thinner by a factor of 2 to 10,000 relative to the thickness of other PBN layer.

15. An article as defined in claim 14 in which the planes along which peeling occur are substantially parallel to one another.

16. An article as defined in 15 wherein the dopant is selected from the group consisting of carbon and/or oxygen or mixtures thereof.

17. An article as defined in claim 16 wherein the total average dopant concentration for dopants of both C and O is above 3.5 atomic % within a distance of 1000 to 2000 angstroms from the peeled surface.

18. An article as defined in claim 17 wherein the median peel strength of each selected layer is above 2 N/mm.

19. An article composed of layers of pyrolytic boron nitride (PBN) separated by layers of PBN doped with one or more elements selected from Group 1–6 of the periodic table, transition metals, rare earth metals or combinations thereof such that the dopant is in a concentration above at least 2 atomic weight % at a depth ranging from about 1000–2000 angstroms measured from the peeled layer and with the thickness of the doped layers being varied relative to one another and being spaced at least one tenth of one micron apart to cause peeling of the doped layers to occur in a given sequence upon a build up of internal stress along a fracture plane in each peeled layer in which dopant is present on both sides of the fracture plane.

20. An article as defined in claim 19 wherein the doped layers are separated by about 0.1 micron to 100 microns.

21. An article as defined in claim 20 wherein the doped layers are thinner by a factor of 2 to 10,000 relative to that of the other PBN layers.

22. An article as defined in claim 21 in which the planes along which peeling occur are substantially parallel to one another.

23. An article as defined in 22 wherein the dopant is selected from the group consisting of carbon and/or oxygen or mixtures thereof.

24. An article as defined in claim 23 wherein the total average dopant concentration for dopants of both C and O is above 3.5 atomic % within a distance of about 1000 to 2000 angstroms from the peeled surface.

25. An article as defined in claim 24 wherein the median peel strength of each selected layer is in the range of 2–5 N/mm.

* * * * *